United States Patent

Sun et al.

Patent Number: 6,075,419
Date of Patent: Jun. 13, 2000

[54] HIGH SPEED WIDE TUNING RANGE MULTI-PHASE OUTPUT RING OSCILLATOR

[75] Inventors: Lizhong Sun; Tadeusz Kwasniewski, both of Ottawa; Kris Iniewski, Coquitlam, all of Canada

[73] Assignee: PMC-Sierra Ltd., Burnaby, Canada

[21] Appl. No.: 09/239,311

[22] Filed: Jan. 29, 1999

[51] Int. Cl.[7] .................................................. H03B 5/02
[52] U.S. Cl. ............................. 331/57; 331/50; 331/56; 331/177 R
[58] Field of Search ................................ 331/57, 46, 50, 331/56, 177 R

[56] References Cited

U.S. PATENT DOCUMENTS

| | | | |
|---|---|---|---|
| 5,457,429 | 10/1995 | Ogawa et al. | 331/57 |
| 5,592,126 | 1/1997 | Boudewijns et al. | 331/57 |
| 5,668,505 | 9/1997 | Vu et al. | 331/57 |
| 5,677,650 | 10/1997 | Kwasiewski et al. | 331/57 |
| 5,896,068 | 4/1999 | Moyal | 331/57 |

OTHER PUBLICATIONS

A.W. Buchwald, K.W. Martin, A.K. Oki and K.W. Kobayashi, "A 6–GHz integrated phase–locked loop using AlGaAs/GaAs heterojunction bipolar transistors," IEEE J. Solid–State Circuits, vol. 27, No. 12, pp 1752–1762, Dec. 1992.

B. Kim, D.N. Helman and P.R. Gray, "A 30 MHz hybrid analog/digital clock recovery circuit in 2–um CMOS," IEEE J. Solid–State Circuits, vol. 25, No. 6, pp. 1385–1394, Dec. 1990.

J.G. Maneatis and M.A. Horowitz, "Precise delay generation using coupled oscillators," IEEE J. Solid–State Circuits, vol. 28, No. 12, pp. 1273–1283, Dec. 1993.

S.J. Lee, B. Kim and K. Lee, "A novel high–speed ring oscillator for multiphase clock generation using negative skewed delay scheme," IEEE J. Solid–State Circuits, vol. 32, pp. 289–291, Feb. 1997.

*Primary Examiner*—Siegfried H. Grimm
*Attorney, Agent, or Firm*—Pascal & Associates

[57] ABSTRACT

A ring oscillator comprising: a plurality of sub-feedback loops, each comprising a pair of serially connected inverters and a feedback inverter having its input coupled to the output of the pair of inverters and its output connected to the input of the pair of inverters, the pairs of inverters being connected in a ring, and a downstream inverter of each respective pair of inverters forming an upstream inverter of an immediately following pair of inverters.

20 Claims, 5 Drawing Sheets

HIGH SPEED WIDE TUNING RANGE MULTI-PHASE OUTPUT RING OSCILLATOR

FIELD OF THE INVENTION

This invention relates to the field of oscillators, and in particular to a ring oscillator formed of complementary metal oxide field effect transistors (CMOS FETs).

BACKGROUND TO THE INVENTION

A voltage controlled oscillator (VCO) is an important building block, which is used in phase-locked loops, clock recovery circuits and frequency synthesizers. High frequency and radio frequency (RF) voltage/current controlled oscillators can be implemented monolithically as inductive-capacitive (LC) oscillators, relaxation oscillators and ring oscillators. Although ring oscillators tend to have poor phase noise characteristics as compared to high Q LC oscillators, they have the advantage of a wider range of oscillation and ease of monolithic integration which results in desirable small integrated circuit die size. Ring oscillators are particularly attractive for use in quadrature clocks and multiphase clock signal generation which is required for many clock recovery circuits and high-speed sampling systems.

High frequency of operation is an important property of many data communication transceivers, wherein the maximum VCO oscillating frequency often limits the maximum obtainable data rate. The oscillation frequency of a conventional ring oscillator is determined by the gate delay in inverting stages and the number of gates in the oscillator. The maximum frequency is attained with an oscillator consisting in three inverters, as described in U.S. Pat. No. 5,457,429 issued Oct. 10, 1995, invented by A. Ogawa et al, and in U.S. Pat. No. 5,677,650 issued Oct. 14, 1997, invented by T. Kwasniewski et al.

In order to obtain additional output oscillation phases which have fixed phase delay with respect to each other, additional gates must be added to the loop. However, the addition of gates reduces the maximum obtainable oscillation frequency. Although a negatively skewed delay scheme had been proposed to reduce the cell delay by S. J. Lee et al in the publication "A Novel High-Speed Ring Oscillator For Multiphase Clock Generation Using Negative Skewed Delay Scheme", in IEEE J. Solid State Circuits, vol. 32, pp. 289–291, February 1997, it has been found that the circuit is sensitive to power supply noise, since the conventional single-ended CMOS inverters which are used have a gate-source voltage which is proportional to the power-supply voltage. When the power supply voltage increases, the charging and discharging currents of the inverters increase in proportion to the square of the power-supply voltage. When the skew delay is larger than twice the inverter delay, the overlap period for both NMOS and PMOS conduction is so high as to cause an undesireably large increase in power consumption.

SUMMARY OF THE INVENTION

The present invention provides a ring oscillator which overcomes the aforenoted problems, and achieves high speed operation, multiple phase output, wide tuning range and low power consumption. It also has the advantage of low sensitivity to noise in the power supply.

In accordance with an embodiment of the invention, a ring oscillator comprises:

(a) a plurality of sub-feedback loops, each comprising a pair of serially connected inverters and a feedback inverter having its input coupled to the output of the pair of inverters and its output connected to the input of the pair of inverters, (b) the pairs of inverters being connected in a ring, and (c) a downstream inverter of each respective pair of inverters forming an upstream inverter of an immediately following pair of inverters.

In accordance with another embodiment, a ring oscillator comprises:

(a) a plurality of inverters, connected serially in a ring, (b) a plurality of sub-feedback loops, each sub-feedback loop being connected with its input to an output of one of the inverters and its output to an input of an inverter which is a number of inverters preceding said one of the inverters, which number is the same for all of said sub-feedback loops, (c) each sub-feedback loop being formed of an odd number of inverters preceding said one of the inverters.

In accordance with another embodiment, a cell for a ring oscillator is comprised of plural cells, each cell comprises a first NMOS FET having its source connected to ground and its drain connected to the drain of a second NMOS FET, the source of the PMOS FET being coupled to a power rail, a circuit for applying a first bias voltage to the gate of the second FET, the gate of the first FET forming an input of the cell and the junction of the first and second FETs forming an output of the cell, a third NMOS FET having its gate connected to the junction of the first and second FETs, a voltage controlled resistor connected between the source of the third FET and ground, the gate of the third FET forming a feedback input, and a control input of the voltage controlled resistor forming a transconductance control for the third FET.

In accordance with another embodiment, a ring oscillator is comprised of a plurality of cells each as described immediately above, in which the output of each respective cell is connected to the input of an immediately following downstream cell, a feedback input of each respective cell is connected to the output of a cell which immediately follows the immediately following downstream cell, and further includes a circuit for applying a control voltage to the control inputs of each of the cells.

In accordance with another embodiment, a cell for a ring oscillator comprising plural cells, each cell is comprised of two pair of source coupled PMOS FETs, a pair of NMOS FETs having their source-drain circuits connected as respective loads for the pairs of PMOS FETs, each pair of PMOS FETs having differential inputs, the sources of the pairs of PMOS FETs being connected to current sources, the junctions of the pairs of PMOS FETs and NMOS FETs forming differential outputs, and a circuit for varying the current of at least one pair of the pairs of PMOS FETs.

In accordance with another embodiment, a ring oscillator is comprised of plural cells, each cell as described immediately above, in which the gates of one pair of PMOS FETs are connected to the respective outputs of an immediately upstream cell, and the gates of the other pair of PMOS FETs are connected to the outputs of a cell which is two cells downstream thereof.

BRIEF INTRODUCTION TO THE DRAWINGS

A better understanding of the invention may be obtained by reading the detailed description of the invention below, in conjunction with the following drawings, in which.

Figure 3:
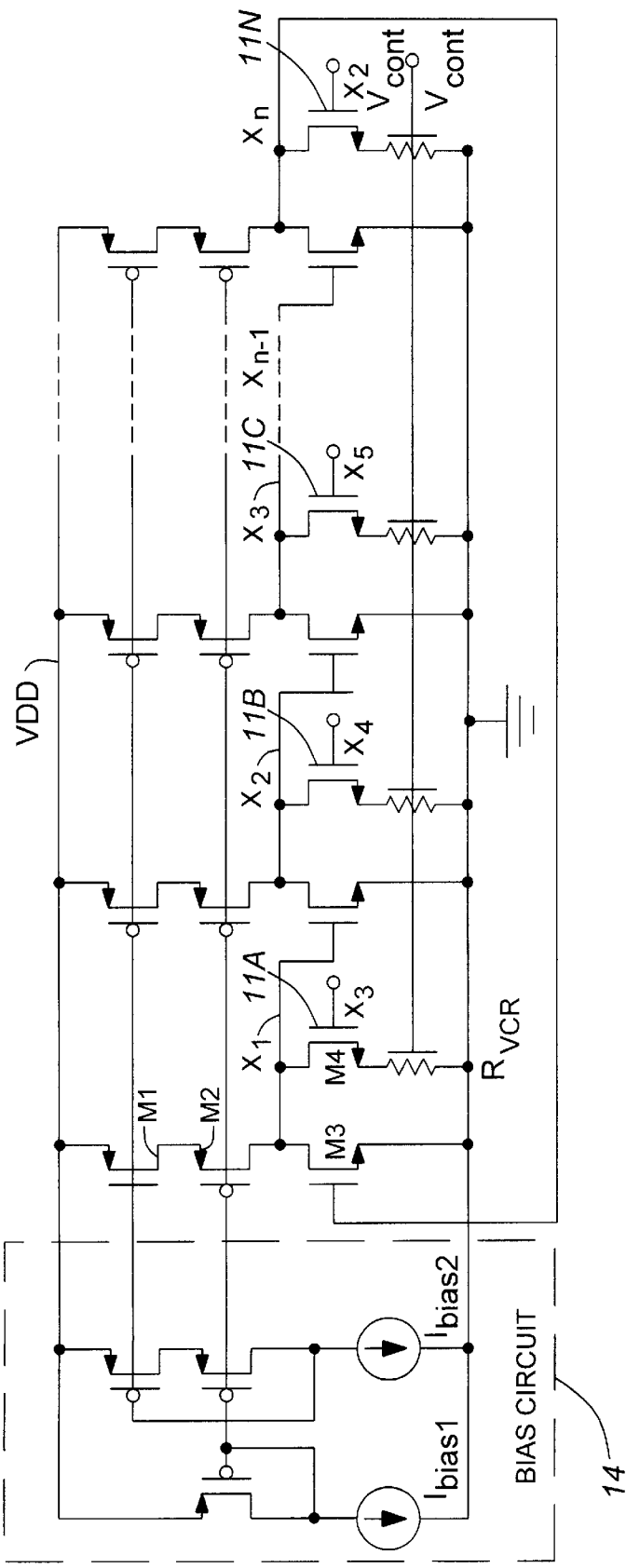
Figure 4:
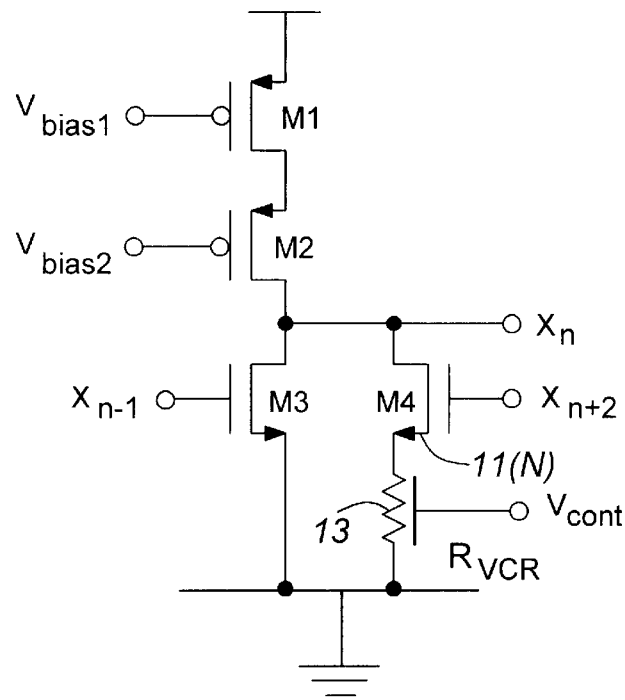
Figure 5:
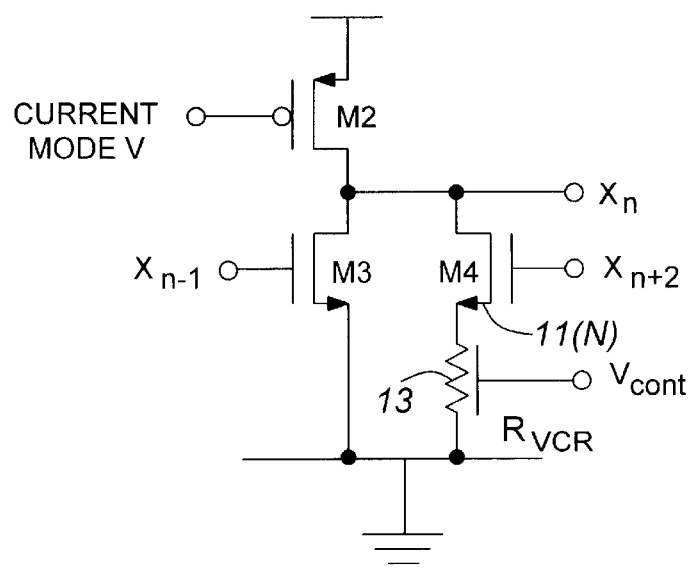
Figure 6:
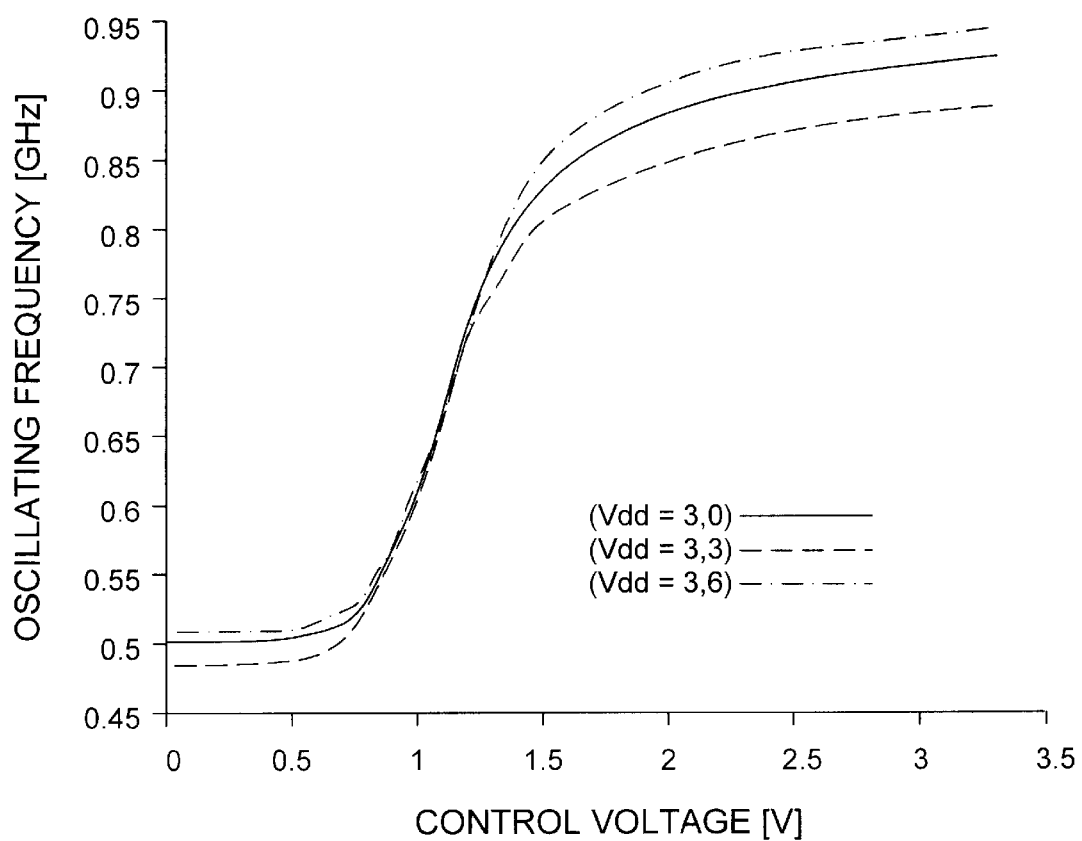
Figure 7:
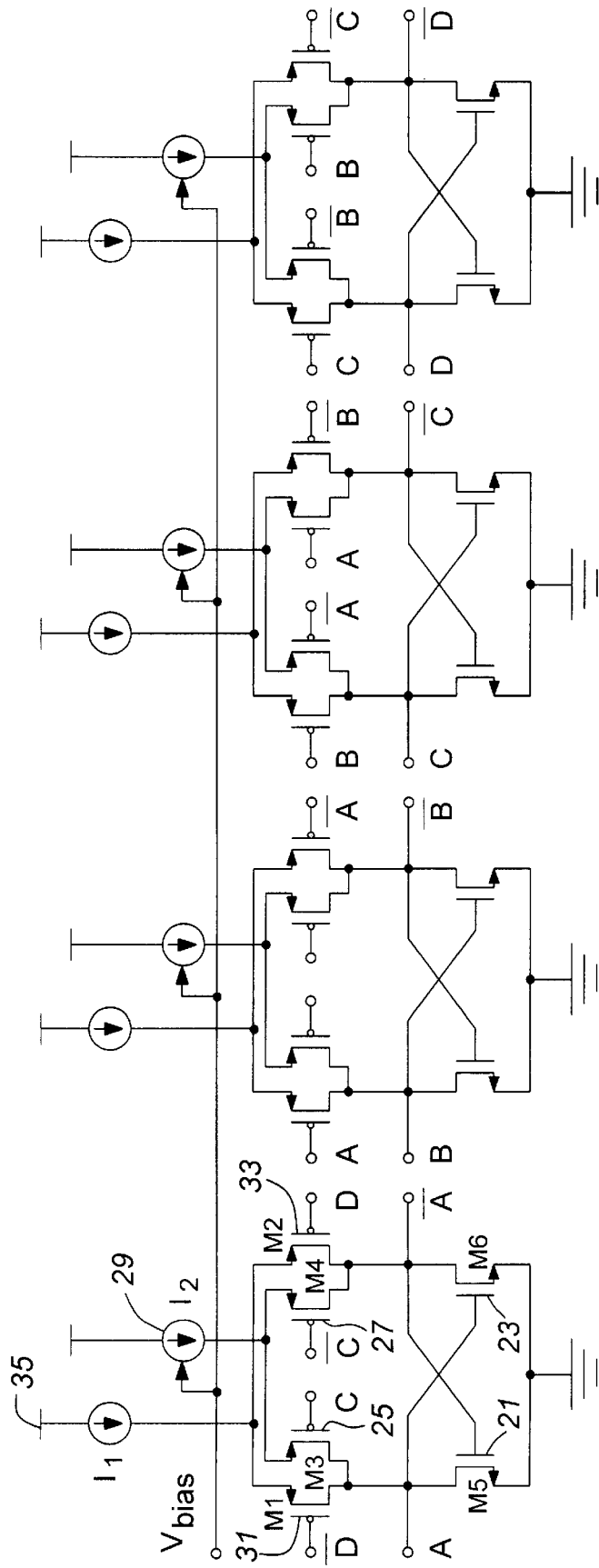

FIG. 3 is a schematic diagram of a voltage controlled ring oscillator in accordance with an embodiment of the invention, FIG. 4 is a schematic diagram of a single delay cell, FIG. 5 is a schematic diagram of another embodiment of a single delay cell, FIG. 6 is a voltage to frequency transfer characteristic of an embodiment of the invention, and FIG. 7 is a schematic diagram of another embodiment of the invention.

DETAILED DESCRIPTION OF EMBODIMENTS OF THE INVENTION

Figure 1:
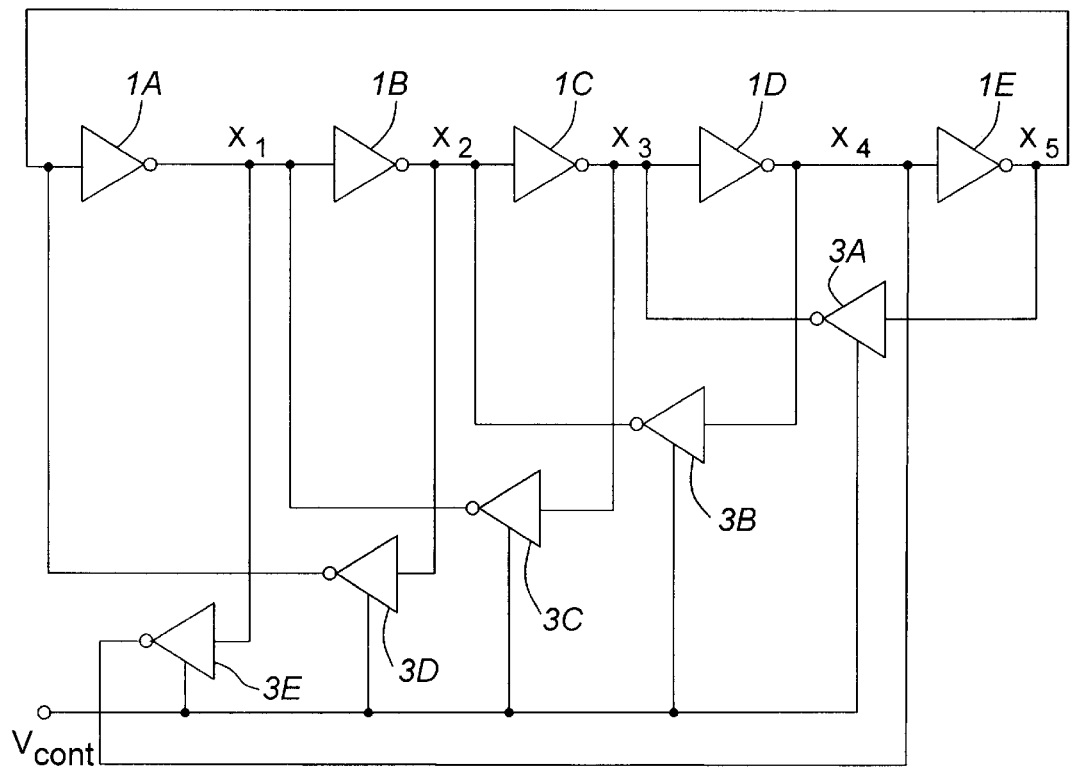
FIG. 1 is a block diagram of an embodiment of the invention.

Turning to FIG. 1, a block diagram of a five stage ring oscillator is shown. Each stage is comprised of an inverter stage, labeled 1A, 1B, 1C, 1D and 1E respectively. For reference purposes the output node of the respective stages are labeled $X_1$, $X_2$, $X_3$, $X_4$ and $X_5$ respectively. To form the loop, the output node $X_5$ of the stage 1E is coupled to the input of stage 1A. This loop is referred to as the slow path.

In accordance with an embodiment of the invention, there are five sub-feedback loops, comprised of inverter stages 3A, 3B, 3C, 3D and 3E. Each inverter stage is coupled from the output of one stage of the slow loop back a predetermined number of stages (two, in this example), to the input of a stage of the slow loop. Thus inverter stage 3A is coupled from the output of inverter stage 1E to the input of inverter stage 1D, inverter stage 3B is coupled from the output of inverter stage 1D to the input of inverter stage 1C, inverter stage 3C is coupled from the output of inverter stage 1C to the input of inverter stage 1B, inverter stage 3D is coupled from the output of inverter stage 1B to the input of inverter stage 1A, and inverter stage 3E is coupled from the output of inverter stage 1A to the input of inverter stage 1E. Each sub-feedback loop inverter stage with the two inverter stages of the slow path is referred to as a fast path. The fast path inverter stages can be formed of three inverters.

The oscillation period can be understood to be the weighted sum of the delays through the fast path and the slow path. It has been found that by control of the delay of the added inverter cell 3N of a fast path, the frequency of oscillation can be tuned over a range of about 5:3 (the range of oscillation is defined as $f_{max}/f_{min}$ where f is the frequency.

The slow path can be extended to include a larger number of stages, which will result in a corresponding increase of the tuning range.

Tuning is accomplished by control of the gain of the feedback inverters 3(N), by means of control voltage $V_{cont}$ which is applied to each of the inverters 3(N).

Figure 2:
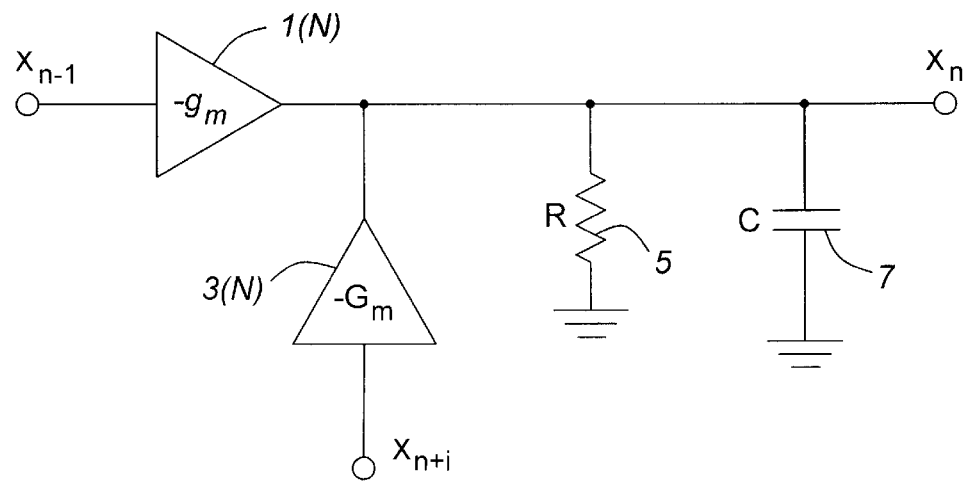
FIG. 2 is a linearized model of a single stage of a ring oscillator.

In order to understand the operation in more detail, consider a model of the signal path in the VCO by means of a linearized circuit, as shown in FIG. 2, in which the oscillation amplitude being small and having a sinusoidal waveform. FIG. 2 is a schematic diagram of a single stage, with the shunt resistance R (5) and shunt capacitance C (7) representing the output resistance and the parasitic load capacitance of each stage, respectively. A representative feedback inverter 3(N) is shown coupled to the output of a representative preceding stage inverter 1(N), the shunt resistance 5 and capacitance 7 being connected to the mutual coupling point of the inverters.

The parasitic load capacitance includes the gate-source capacitance of the input transistor of the succeeding stage and the output capacitance of the (i)th stage, the latter normally being due to junction capacitance, drain wiring to the substrate, etc.

For a ring oscillator, there is a fixed phase relationship between stages during steady-state oscillation. Assuming that all stages are the same, the transfer function $H(j\omega)=V_n/V_{n-1}$ of a single stage can be found as:

$$H(j\omega) = \frac{-g_m R}{(1 + G_m R\cos\Phi) + j(\omega RC - G_m R\sin\Phi)} \quad (1)$$

Where $g_m$ and $G_m$ represent the transconductance of an inverter 1(N) in the main loop and of an inverter 3(n) in the sub-feedback loop respectively. $\Phi$ is the phase difference between any node n and any other node (n+i), where i represents the number of stages that feedback is derived from.

According to the Barkhausen criterion of oscillation, the ring oscillator will oscillate if, at $\omega_o$, the loop has unity voltag gain and a phase shift of $2\pi$ or a multiple of $2\pi$.

Thus equation (1) becomes:

$$\omega_0 = \frac{G_m R \sin\Phi + tg\theta(1 + G_m R\cos\Phi)}{RC} \quad (2)$$

The minimum required DC gain is expressed as:

$$g_m R = \sqrt{(1 + G_m R\cos\Phi)^2 + (\omega RC - G_m R\sin\Phi)^2} \quad (3)$$

With $\theta$ being the phase difference between adjacent nodes n and (n−1), equation (2) can be rewritten as:

$$\omega_0 = \omega_{01} + \Delta\omega = \frac{tg\theta}{RC} + \frac{G_m R [\sin(i\theta) + tg\theta\cos(i\theta)]}{RC} \quad (4)$$

Since $\theta$ is fixed for a given number of stages ring oscillator, the increase or decrease of oscillation frequency depends on the parameter i, which represents the number of stages that the feedback signal is derived from. For the five stage ring oscillator, each stage has a phase shift of $\theta=6\pi/5$.

When i=2, as in the example given here meaning that the feedback signal is derived from a two stage delay in the main loop, $\Phi=2\pi/5$.

Imposing phase shift conditions to equation (4), the operating frequency is related to $$\omega_0 = 0.726/(RC) + 1.175(G_m/C) \quad (5)$$

And minimum required DC gain is $$g_m R = 1.23(1 + 0.3 G_m R) \quad (6)$$

As compared with that of a conventional ring oscillator in which $\omega_o = 0.726/RC$, the oscillation frequency in this invention is increased by $\Delta\omega = 1.175(G_m/C)$, wherein $G_m$ can be controlled by an external voltage.

It should be noted that because of nonlinearity in the active devices, the zero-phase frequency is not exactly equal to the steady-state frequency of the oscillator. Nevertheless, the above is a good approximation for analysis for relative frequency improvement.

Turning now FIG. 3, to a schematic diagram of a voltage controlled ring oscillator in accordance with an embodiment of the invention, the output nodes X(1)–X(n) are shown, which correspond to the same nodes in FIG. 1. FETs forming the feedback inverters are labeled 11A, 11B . . . 11N. In order to keep the schematic diagram from being cluttered with difficult to follow connections, the node points and their connections to the feedback inverters have been correspondingly labeled. Thus for example, the output node X3 is connected to the gate of FET 11A.

For each stage of the main loop, shown in more detail in FIG. 4, wide swing PMOS FET current sources M1 and M2 are connected with their source-drain circuits in series between a power supply rail and the gate of an inverter NMOS FET M3. FETs M1 and M2 are used as an active load. FET M3 is connected as a common source transistor, with its source to ground.

The feedback inverter PMOS FET M4 is also connected as a common source transistor, but with source degeneration, by having its source connected through a voltage controlled resistor 13 ($R_{VCR}$) to ground. The drains of FETs M3 and M4 are connected together, which point also forms the output Xn of the stage. The frequency control mechanism is achieved through control of the resistance of the voltage controlled resistor, which controls the transconductance of the feedback inverter FET 11(N).

The voltage controlled resistors 13 control the discharge current path in each of the sub-feedback loops. FET M4 and resistor $R_{VCR}$ together provide a voltage controlled feedback transconductance $G_m$ to the oscillator. As will be noted from equation (5), a higher oscillation frequency is achieved with an increase of $G_m$. It should be noted that phase relationships between stages do not change when the control voltage $V_{cont}$ is varied.

The use of a cascoding current source in the load (i.e. use of both FETs $M_1$ and $M_2$, with bias voltages $V_{bias1}$ and $V_{bias2}$ applied to their respective gates), buffers the output from the power supply Vdd. Since the voltage swings in the VCO are not voltage rail-to-voltage rail, the PMOS loads are in saturation for most of the time, thereby reducing the noise injected from Vdd to the output. The use of a current source in the load also prevents the excessive increase of power consumption when the operating frequency increases.

However, a cascoding current source can be replaced by a conventional current source as shown in FIG. 5, to allow one reference voltage to be used, but at a cost of finite output impedance at the load. As may be seen from FIG. 5, FET M1 has been eliminated.

FIG. 6 is a plot of a voltage to frequency transfer characteristics of a 5 stage ring oscillator as described, taken from a simulator. The simulation was based on a 0.35 μm MOSFET process at a temperature of 75 degrees C. with power supply Vdd of 3.0 V, 3.3 V and 3.6 V. A single NMOS FET with its gate connected to the external control voltage is used as each voltage controlled resistor $R_{VCR}$. It was found that the sensitivity of the VCO to power supply variations, i.e. (Δf/f)/ΔVdd is very low (<1%/V) when the control voltage is approximately 1.2 V. The voltage control linearity can be improved by the use of a linearized resistor.

The use of voltage controlled resistors has the additional advantage that a voltage to current converter which is comprised of an operational amplifier and current mirrors is not needed. Instead, the current source can be connected to a temperature compensated biasing circuit to improve the temperature sensitivity.

FIG. 7 illustrates an alternative oscillator structure, which is differential in form, and which has imbedded sub-feedback loops. This example has four stages in the slow loop. Each cell is comprised of a pair of crosscoupled NMOS FETs 21 and 23 (M5 and M6), connected between ground and the drains of respective pairs of PMOS FETs 25 and 27 (M3 and M4) whose sources are connected together to a controllable current source 29 ($I_2$). The crosscoupled FETs 21 and 23 are also connected to the drains of a pair of NMOS FETs 31 and 33, whose sources are connected together to current source 35 ($I_1$).

The differential inputs A, /A, B, /B, C, /C and D, /D are labeled on each of the cells which are shown, with similar labeled nodes on each being connected together. Each cell of the VCO forms a differential inverter with two pairs of source-coupled PMOS input FETs (M1, M2) and (M3, M4). The NMOS FET pair (M5, M6) is used as the load of the differential inverter. The crosscoupled structure of FETs M5 and M6 increases the gain of the cell. However, they can be replaced by diode-connected FETs.

The gates of FETs M1 and M2 are connected to the output of the previous (n−1) stage (n representing the current stage), and the gates of FETs M3 and M4 are connected to the outputs of the (n+2) stage to establish the sub-feedback loop.

The current source $I_1$ is biased to cover the slowest required frequency. By increasing the current in current source $I_2$, the delay in the fast path is reduced and the oscillation frequency is increased. Since the oscillation frequency is more sensitive to $I_2$ than to $I_1$, the oscillation frequency can be tuned over a wide range.

It should be recognized that the FET conductivity types described herein can be changed to opposite polarity types with attendant change in the polarity of the voltage used, as will be understood by a person skilled in the art understanding this invention.

A person understanding the above-described invention may now conceive of alternative designs, using the principles described herein. All such designs which fall within the scope of the claims appended hereto are considered to be part of the present invention.

We claim:

1. A ring oscillator comprising:
   (a) a plurality of sub-feedback loops, each comprising a pair of serially connected inverters and a feedback inverter having its input coupled to the output of the pair of inverters and its output connected to the input of the pair of inverters,
   (b) the pairs of inverters being connected in a ring, and
   (c) a downstream inverter of each respective pair of inverters forming an upstream inverter of an immediately following pair of inverters.

2. A ring oscillator as defined in claim 1, further including means for controlling the transconductance of each of the feedback inverters.

3. A ring oscillator as defined in claim 2 in which the feedback inverters are inverting gain stages.

4. A ring oscillator as defined in claim 1, further including means for controlling the transconductance of all of the feedback inverters together, to substantially the same value.

5. A ring oscillator comprising:
   (a) a plurality of inverters, connected serially in a ring,
   (b) a plurality of sub-feedback loops, each sub-feedback loop being connected with its input to an output of one of the inverters and its output to an input of an inverter which is a number of inverters preceding said one of the inverters, which number is the same for all of said sub-feedback loops,
   (c) each sub-feedback loop being formed of an odd number of inverters preceding said one of the inverters.

6. A ring oscillator as defined in claim 5 in which each sub-feedback loop has a control input for receiving a control signal for controlling its gain.

7. A ring oscillator as defined in claim 6 in which the control signal is the same for all sub-feedback loops.

8. A ring oscillator as defined in claim 6 in which each sub-feedback loop has an odd number of inverters in excess of two coupled in series.

9. A ring oscillator as defined in claim 8 in which the odd number is three.

10. A ring oscillator as defined in claim 9 in which the control signal is the same for all sub-feedback loops.

11. A ring oscillator as defined in claim 7 in which the control signal is variable, for controlling the oscillation frequency of the ring oscillator.

12. A ring oscillator as defined in claim 10 in which the control signal is variable, for controlling the oscillation frequency of the ring oscillator.

13. A cell for a ring oscillator comprised of plural cells, each cell being formed of a first NMOS FET having its source connected to ground and its drain connected to the drain of a second PMOS FET, the source of the second FET being coupled to a power rail, a circuit for applying a first bias voltage to the gate of the second FET, the gate of the first FET forming an input of the cell and the junction of the first and second FETs forming an output of the cell, a third NMOS FET having its drain connected to the junction of the first and second FETs, a voltage controlled resistor connected between the source of the third FET and ground, the gate of the third FET forming a feedback input, and a control input of the voltage controlled resistor forming a transconductance control for the third FET.

14. A cell as defined in claim 13, further including a fourth FET having its source-drain circuit connected, in the same conductivity direction as the second FET, between the source of the second FET and the power rail, and a circuit for applying a second bias voltage to the gate of the fourth FET, whereby the second and fourth FET with power from the power rail form a current source.

15. A ring oscillator comprising a plurality of cells each as defined in claim 13, the output of each respective cell being connected to the input of an immediately following downstream cell, a feedback input of each respective cell being connected to the output of a cell which immediately follows the immediately following downstream cell, and a circuit for applying a control voltage to the control inputs of each of the cells.

16. A ring oscillator comprising a plurality of cells each as defined in claim 14, the output of each respective cell being connected to the input of an immediately following downstream cell, a feedback input of each respective cell being connected to the output of a cell which immediately follows the immediately following downstream cell, and a circuit for applying a control voltage to the control inputs of each of the cells.

17. A cell for a ring oscillator comprising plural cells, each cell being comprised of two pairs of source coupled PMOS FETs, a pair of NMOS FETs having their source-drain circuits connected as respective loads for the pairs of PMOS FETs, each pair of PMOS FETs having differential inputs, the sources of the pairs of PMOS FETs being connected to current sources, the junctions of the pairs of PMOS FETs and NMOS FETs forming differential outputs, and a circuit for varying the current of at least one pair of the pairs of PMOS FETs.

18. A ring oscillator comprised of plural cells, each cell as defined in claim 17, the gates of one pair of PMOS FETs being connected to the respective outputs of an immediately upstream cell, and the gates of the other pair of PMOS FETs being connected to the outputs of a cell which is two cells downstream thereof.

19. A ring oscillator as defined in claim 18 in which the circuit for varying the current is comprised of means for varying the current of only said other pair of PMOS FETs.

20. A ring oscillator as defined in claim 17, in which the drains and gates of the NMOS FETs are cross-coupled.

* * * * *